(12) United States Patent
Van Rumpt

(10) Patent No.: US 7,286,807 B2
(45) Date of Patent: Oct. 23, 2007

(54) RECEIVER WITH A CASCADE OF RESONANT AMPLIFIERS IN THE RF INPUT STAGE

(75) Inventor: Herman Wouter Van Rumpt, s'Hertogenbosch (NL)

(73) Assignee: Semiconductor Ideas to Market (ITOM) BV, Breda (NL)

( * ) Notice: Subject to any disclaimer, the term of this patent is extended or adjusted under 35 U.S.C. 154(b) by 286 days.

(21) Appl. No.: 10/204,493

(22) PCT Filed: Feb. 9, 2001

(86) PCT No.: PCT/EP01/01514

§ 371 (c)(1),
(2), (4) Date: Aug. 20, 2002

(87) PCT Pub. No.: WO01/63762

PCT Pub. Date: Aug. 30, 2001

(65) Prior Publication Data

US 2003/0171104 A1 Sep. 11, 2003

(30) Foreign Application Priority Data

Feb. 24, 2000 (EP) .................................. 00200644

(51) Int. Cl.
*H04B 1/06* (2006.01)

(52) U.S. Cl. ................ 455/234.2; 455/248.1; 330/310

(58) Field of Classification Search ............. 455/232.1, 455/234.1, 234.2, 241.1, 245.2, 246.1, 250.1, 455/266, 340, 248.1; 375/345; 330/278, 330/291, 295, 310, 311
See application file for complete search history.

(56) References Cited

U.S. PATENT DOCUMENTS

| 3,944,932 | A | * | 3/1976 | Fong ........................ 375/350 |
| 5,220,686 | A | * | 6/1993 | Kasperkovitz et al. ... 455/234.1 |
| 5,548,831 | A | * | 8/1996 | Bijker et al. ................ 455/207 |
| 5,715,529 | A | * | 2/1998 | Kianush et al. ............ 455/266 |
| 2004/0097208 | A1 | * | 5/2004 | Kasperkovitz ........... 455/234.1 |

OTHER PUBLICATIONS

Ichihiko Toyoda et al., "Three-Dimensional Masterslice MMIC on Si Subtrate", IEEE, vol. 45, No. 12, Dec. 1997, pp. 2524-2530.*

* cited by examiner

*Primary Examiner*—Nguyen T. Vo
(74) *Attorney, Agent, or Firm*—Robert M. McDermott, Esq.

(57) ABSTRACT

Receiver comprising a cascade of first to N resonance amplifiers (SA1, SA2, SA3), an output thereof being coupled to signal processing means (TO, SD, PK, LP1, S) for deriving a baseband modulation signal. To improve the signal to noise ratio said cascade is included in an RF input stage of the receiver for a distributed selective amplification of an RF reception signal, preferably with an impedance level of the individual resonance amplifiers within said cascade of first to N resonance amplifiers increasing in signal downstream direction.

17 Claims, 3 Drawing Sheets

RECEIVER WITH A CASCADE OF RESONANT AMPLIFIERS IN THE RF INPUT STAGE

Figure 1A:
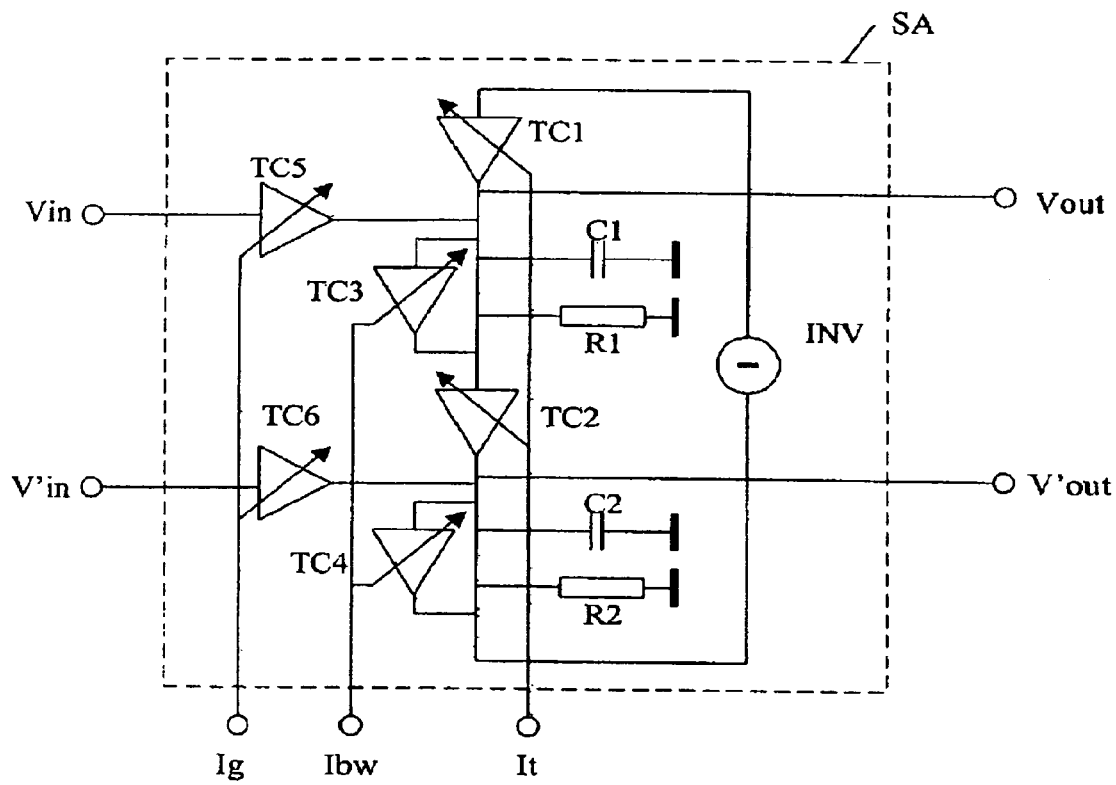

The invention relates to a receiver comprising a cascade of first to N resonance amplifiers being included in an RF input stage of the receiver for a distributed amplification of an RF reception signal, an output thereof being coupled to signal processing means for deriving a baseband modulation signal. Such receiver is on itself known, e.g. from the article "Three-Dimensional Masterslice MMIC on Si Substrate" by Toyoda et al, published in IEEE Transactions on Microwave Theory and Techniques, US, IEEE Inc., New York, volume 45, no. 12, Part 02, 1 Dec. 1997 (Dec. 12, 1997), pages 2524-2530, XP000732041 ISSN: 0018-9480. The amplifiers used in this known RF input stage provide distributed amplification of an RF input signal within a wide band frequency range in the order of magnitude of 6 GHz or more. The use of resonance amplifiers in a cascade in the IF part of a conventional superhet receiver concept to selectively amplify an IF signal is on itself known from U.S. Pat. No. 5,220,686. Furthermore, a non-cascaded application of a plurality of N gain stages in an RF input stage of a radio receiver is known from WO 99 46855 A (Koninklijke Philips Electronics N.V.; Philips A B (SE), published on 16 Sep. 1999. These gain stages do not provide distributed amplification as only one of these gain stages at a time is being activated.

Said cascade of first to N resonance amplifiers is on itself suitable for integration. However, the use thereof in a superhet receiver does not allow for full receiver integration, because of the specific system architecture of the conventional superhet concept. The advantages of fully integrated receiver architectures over conventional receiver architectures are known: they will offer a much smaller physical size and a much lower cost price. Such monolithically integrated receivers are in particular advantageous for use in specific applications, including clock controlled devices (e.g. radio's in PDAs, lap-tops, GSM, etc). Up to now the performance of these fully integrated receiver architectures was always lower due to the limitations of the signal processing properties of active devices compared to the (discrete) passive ones. Important indicators of signal processing performance are e.g. sensitivity, far-off and channel selectivity, dynamic range and tuning behaviour.

The cost price of a monolithic integrated receiver is, as of any IC, a complex quantity being determined a.o. by external components (X-tal, antenna, large time constants), chip area and yield (matching, spread).

It is a first object of the invention to offer a receiver architecture, which can be monolithically integrated.

It is a second object of the invention optimise the price/performance ratio of such monolithically integrated receiver.

It is a third object of the invention to provide measures to decrease the chip area of an integrated receiver without giving in on performance.

A receiver comprising a cascade of first to N resonance amplifiers, an output thereof being coupled to signal processing means for deriving a baseband modulation signal, according to the invention is therefore characterised in that said first to N resonance amplifiers in the cascade providing selective distributed amplification, the impedance level of the individual resonance amplifiers within said cascade of first to N resonance amplifiers increasing in signal downstream direction.

The invention is based on the recognition that with a selective RF signal amplification distributed over a number of cascaded resonance amplifiers, various parameters of the individual resonance amplifiers, such as noise figure and far-off selectivity work out differently on the overall characteristic of the cascade, dependent on the position of the resonance amplifier in the cascade. The noise figure of the first resonance amplifier, i.e. the resonance amplifier being first supplied with the RF reception signal, has a larger weight in the overall noise figure of the cascade as a whole than its succeeding or second resonance amplifier and so forth. On the other hand, the far-off selectivity of the first resonance amplifier may be much less, or in other words the bandwidth may be larger, without giving in on the overall far-off selectivity of the cascade as a whole, than the second one, and so forth. By taking this into account when applying distributed RF amplification, an optimised trade-off between said signal parameters can be obtained allowing for further receiver signal processing with circuitry, which in itself is very much suitable for integration.

According to the invention, such optimised trade off is obtained by increasing the impedance level of the individual resonance amplifiers within said cascade of first to N resonance amplifiers in signal downstream direction. This allows for a decreasing scaling factor, i.e. a decrease of the set currents (Ig, It, Ibw) and capacitances C of the resonance amplifiers in the cascade in signal downstream direction without affecting the performance compared with the known receiver with identical stages resulting in a decrease of the chip area needed, while strongly reducing the chip area needed.

A preferred embodiment of a receiver according to the invention is characterised in that the noise figure of the individual resonance amplifiers within said cascade of first to N resonance amplifiers decrease in signal upstream direction. For an implementation of this measure, use is made of the recognition that for a selective resonance amplifier as mentioned above, $Vnoise=sqrt(fc/(B*C))$ in which Vnoise represents the noise figure of a resonance amplifier, fc the center passband frequency of the resonance amplifier, B the bandwidth and C the capacitance value of the resonance amplifier and allows for to an optimised trade off between Vnoise, B and C per each resonance amplifier in the cascade, without affecting the overall noise figure of the cascade as a whole.

Another preferred embodiment of a receiver according to the invention optimised in terms of selectivity is characterised in that the bandwidth of the individual resonance amplifiers within said cascade of first to N resonance amplifiers decrease in signal downstream direction.

Figure 1B:
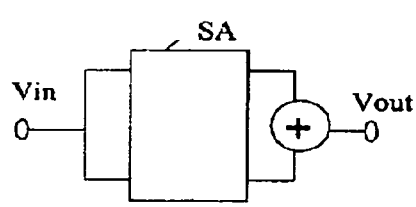
Figure 1C:
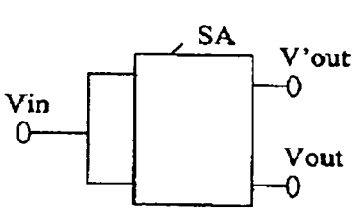
Figure 1D:
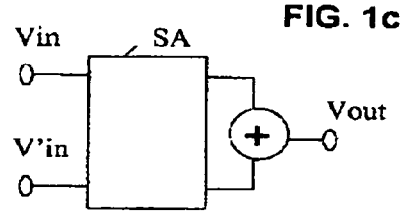
Figure 2:
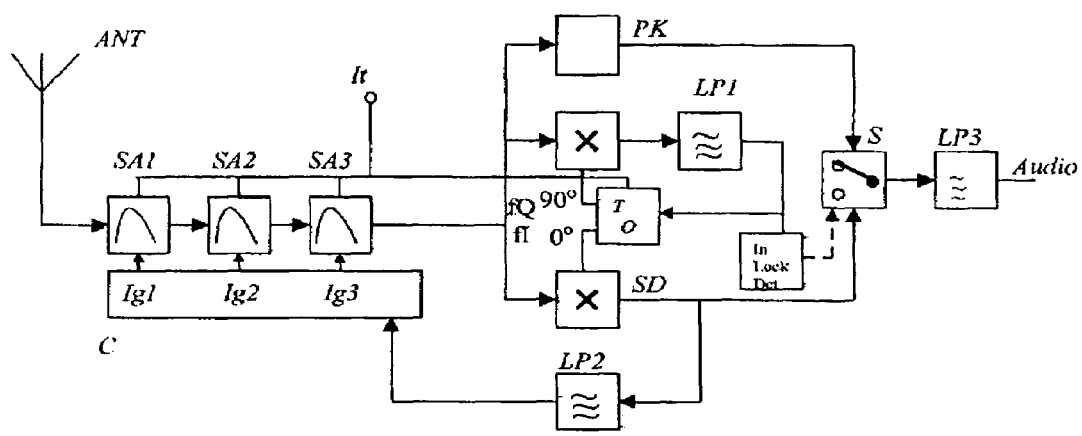
Figure 3:
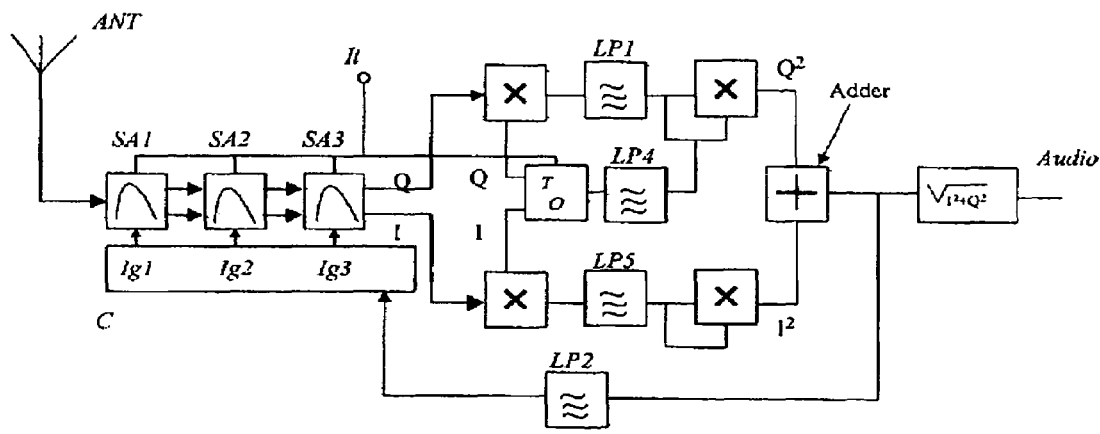
Figure 4:
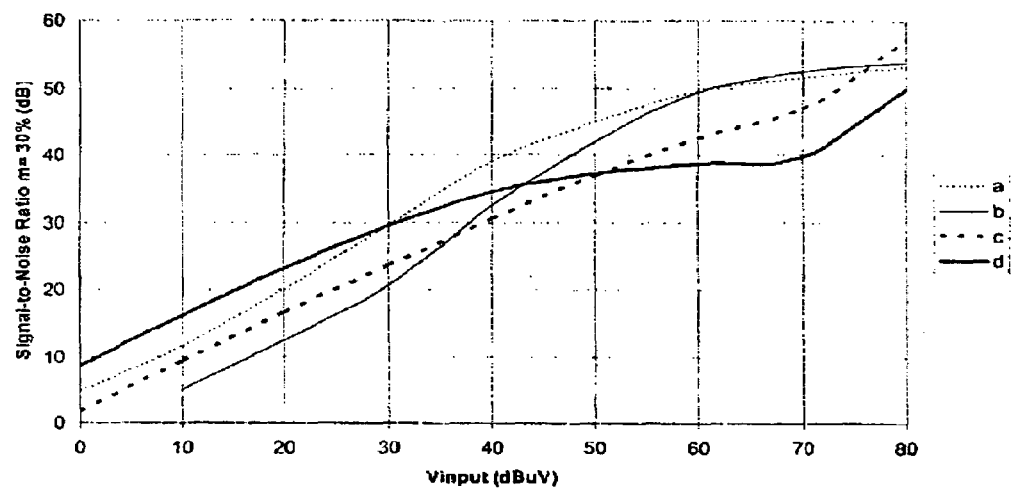
Figure 5:
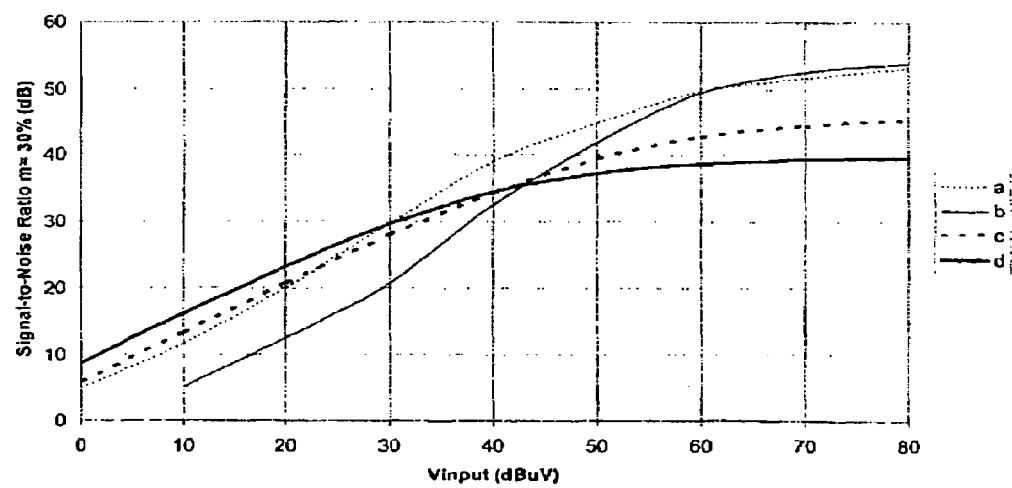

These and further aspects and advantages of the invention will be discussed more in detail hereinafter with reference to the disclosure of preferred embodiments, and in particular with reference to the appended Figures, in which corresponding elements have like references, showing in:

FIG. 1a a general circuitry diagram of a resonance amplifier for use in a receiver according to the invention;

FIGS. 1b-1d various modes of operation of the resonance amplifier of FIG. 1a;

FIG. 2 a first embodiment of a receiver according to the invention;

FIG. 3 a second embodiment of a receiver according to the invention;

FIG. 4 a signal plot showing the effect of a selectivity increase of the resonance amplifiers in downstream direction on the S/N ratio of the cascade as a whole;

FIG. 5 a signal plot showing the effect of a scaling factor increase of the resonance amplifiers in downstream direction on the S/N ratio of the cascade as a whole.

FIG. 1a shows a selective resonance amplifier SA corresponding to the one shown in FIG. 3 of U.S. Pat. No. 5,220,686. The resonance amplifier SA comprises a cascade of first and second controllable transconductance amplifiers TC1 and TC2. an output of TC2 being negatively fed back through an inverter INV to an input of TC1 and outputs of TC1 and TC2 being coupled to respective mass connected parallel RC members R1C1 and R2C2. TC1 and R1C1 respectively TC2 and R2C2 fuctioning as first and second active poly-phase transconductance filter sections. The common connections of TC1 and R1C1, respectively TC2 and R2C2, constitute quadrature current inputs Iin, respectively I'in and/or quadrature voltage outputs Vout, respectively V'out. A set current It can be supplied to control terminals of TC1 and TC2 to set the transconductance of TC1 and TC2 and therewith the resonance frequency fres of the resonance amplifier SA to a predetermined value. The resonance amplifier SA is also provided with third and fourth controllable transconductance amplifiers TC3 and TC4, each of which is fed back from the output to the input and is arranged at the outputs fo TC1 and TC2, respectively. These transconductance amplifiers TC3 and TC4 realise an extra negative resistor, which can be considered to be arranged parallel to the parallel RC members R1C1 and R2C2, respectively. By applying a fixed set current Ibw to control terminals of TC3 and TC4, the transconductance of TC3 and TC4 and therewith the bandwidth or selectivity of the resonance amplifier SA can be set to a predetermined value without affecting its tuning frequency. Fifth and sixth transconductance amplifiers TC5 and TC6 are included between quadrature voltage inputs Vin and V'in of the resonance amplifier SA on the one hand and the above current inputs Iin and I'in of the resonance amplifier SA on the other hand. By supplying a gain control current Ig to control terminals of TC5 and TC6 the overall gain of the resonance amplifier SA can be varied without affecting the resonance frequency fres and/or the bandwidth of the resonance amplifier SA. In the embodiment shown, the resonance amplifier SA can be used to selectively amplify a pair of phase-quadrature signals, hereinafter referred to as first amplification mode.

By mutually coupling the quadrature voltage inputs Vin and V'in, respectively the quadrature voltage outputs Vout and V'out, as shown in FIG. 1b, the resonance amplifier SA can be used to selectively amplify a single phase input signal into a single phase output signal hereinafter referred to as second amplification mode.

By mutually coupling the quadrature voltage inputs Vin and V'in of the resonance amplifier SA, as shown in FIG. 1c, the resonance amplifier SA selectively amplifies a single phase input signal, while converting the same into a pair of phase-quadrature output signals Vout and V'out, this mode of operation of the resonance amplifier SA being hereinafter referred to as third amplification mode.

By mutually coupling the quadrature voltage outputs Vout and V'out, the resonance amplifier SA selectively amplifies a pair of phase-quadrature input signals while converting the same into a mon-phase output signal this mode of operation of the resonance amplifier being hereinafter referred to as fourth amplification mode.

The description of the resonance amplifier SA given so far is sufficient for a proper understanding of the invention. For more information of the resonance amplifier SA, reference is made to the above U.S. Pat. No. 5,220,686.

FIG. 2 shows an embodiment of a receiver according to the invention comprising a cascade of respectively first to N (N=3) resonance amplifiers SA1, SA2, SA3, hereinafter also referred to as "cascade", for a selective amplification of an RF reception signal being supplied from antenna means ANT to an RF input of the cascade. Each of the resonance amplifiers SA1, SA2, SA3 correspond to the one of FIG. 1b operating in the above second amplification mode, however according to the invention, they differ mutually in their settings with regard to the bandwidth or selectivity and/or their scaling factor or impedance level, such that:

the bandwidth of SA3 is smaller than the bandwidth of SA2 and the bandwidth of SA2 is smaller the bandwidth of SA1, i.e. the bandwidth of the resonance amplifiers SA1, SA2 and SA3 decreases in signal downstream direction. Such bandwidth setting is obtained by a proper set value for the bandwidth set currents Ibw of SA1, SA2 and SA3. The selectivity of the resonance amplifiers SA1, SA2 and SA3 therewith increases in signal downstream direction.

The bias setpoints or scaling factor of the resonance amplifier SA1 is larger than the bias setpoints or scaling factor of the resonance amplifier SA2, which in its turn is larger than the bias setpoints or scaling factor of the resonance amplifier SA3. As a result thereof the capacitance C and therewith the impedance level of SA1, SA2 and SA3 increases in signal downstream direction allowing to reduce the chip area, necessary for an implementation of the cascade, without giving in on the overall noise figure of the cascade.

Said cascade of first to N resonance amplifiers is coupled to baseband signal demodulation means comprising a.o. a tuning oscillator TO providing a pair of phase quadrature oscillator signals fi (0°) and fq (90°), the in-phase oscillator signal fi (0°) being supplied as a local synchronous RF carrier to a carrier input of the synchronous detector SD and the quadrature phase oscillator signal fq (90°) being provided to a carrier input of the phase detector PD. The tuning oscillator TO is preferably implemented by using a regeneratively fedback resonance amplifier (not shown). The phase detector PD is included in a phase locked loop (PLL) comprising a loop filter LP1 coupled between an output of PD and a tuning control input of the tuning oscillator TO. The PLL provides a negative feedback of phase differences between the carrier signal of the selectively amplified output signal of the cascade on the one hand and the phase quadrature oscillator signal of TO on the other hand, therewith phase synchronising the pair of phase quadrature oscillator signals to the incoming RF carrier signal. The tuning oscillator TO is also manually variable to a wanted RF carrier frequency with a tuning control current It supplied to a tuning control input of the tuning oscillator TO. Along with the tuning of TO, the tuning control current It is also supplied to tuning inputs of SA1, SA2 and SA3 to secure a mutually parallel tuning between TO on the one hand and SA1, SA2 and SA3 on the other hand. Outputs of the synchronous detector SD and the amplitude detector PK are coupled to first and second switching terminals of a switching device S for connecting one of those detectors to a common output terminal of the switching device S. Said common switching device output terminal is coupled to baseband modulation signal processing means, comprising a lowpass filter LP3 for selecting the useful baseband modulation signal, e.g. an audiosignal, from the output signal of the switching device S.

The switching device S is controlled by an in-lock detector LD being coupled between an output of the loop filter LP1 on the one hand and a switching control terminal of the switching device S on the other hand and detecting the in-lock state of the PLL from the level of the oscillator phase control signal in the PLL. The implementation of such in-lock detector LD lies within the normal abilities of the skilled man, reason for which no further details of the in-lock detector LD is given. The in-lock detector LD controls the switching device S to couple an output of the synchronous detector SD to the common output terminal of the switching device S when the PLL is locked to a wanted RF carrier frequency and to couple the amplitude detector PK to said common output terminal when the PLL is out of lock. If in lock, the output signal of SD provides a better signal-to-noise ratio than the output signal of PK. If the PLL is out of lock, i.e. fi (0°) is not phase/frequency synchronised with the RF carrier signal at the output of the cascade, then it is the amplitude detector PK providing a better signal-to-noise ratio than the synchronous detector SD. This secures an optimal reception of the receiver in terms of signal to noise ratio at varying signal reception quality.

The gain distribution of the resonance amplifiers SA1, SA2 and SA3 is chosen to optimise for the noise figure of the cascade as a whole. Preferably, the signal gain per each resonance amplifier SA1, SA2 and SA3 is chosen to decrease in signal downstream direction. Furthermore, the receiver shown is provided with an AGC loop, which includes the synchronous detector SD being coupled through a lowpass filter LP2 to an input of gain control signal generating means C. The gain control signal generating means C derives gain control currents Ig1, Ig2 and Ig3 from the output signal of the lowpass filter LP2 being supplied to gain control input terminals of the respective resonance amplifiers SA1, SA2 and SA3 of the cascade, such that any deviation in the signal input level of SD (and therewith also any deviation in the signal input level of PD and PK) from a predetermined set level is negatively fed back to the gain control input terminals of the respective resonance amplifiers SA1, SA2 and SA3. This results in a reduction of such deviations, therewith effecting a stabilisation of said signal input level at said predetermined set level.

Preferably, the gain factors of the gain control currents Ig1, Ig2 and Ig3 in the AGC loop are chosen to mutually deviate, such that a variation of the RF input signal level causes the gain of the first resonance amplifier SA1 to vary stronger than the gain of the second resonance amplifier SA2 and the gain of the second resonance amplifier SA2 to vary stronger than the gain of the third resonance amplifier SA3 of the cascade. This measure results in a further improvement of the signal-to-noise ratio of the cascade, which come in addition to the improvement in signal-to-noise ratio obtained with the above settings of SA1, SA2 and SA3.

The gain control ranges of SA1, SA2 and SA3 are furthermore chosen to be mutually shifted to provide a deferred or delayed amplification in the respective resonance amplifiers at a decrease of the received RF signal carrier. Such deferred or delayed amplification is as such known and is to maximise the overall range of linear amplification of the cascade.

The implementation of gain control signal generating means C providing the above specified functions lies on itself within the ability of one skilled in the art.

The AM-receiver shown in this FIG. 2 is suitable for monolithic integration and may be used for receiving various different categories of broadcasting signals, such as e.g. radio broadcast AM-signals, vestigial sideband television broadcast signals, etc.

FIG. 3 shows a second embodiment of a receiver according to the invention in which the first resonance amplifier SA1 in the cascade operates in the above third mode of amplification, i.e. the inputs being coupled in accordance with the resonance amplifier SA as shown in FIG. 1c, and in which the second and third resonance amplifier SA2 and SA3 both operate in the above first mode of operation. The antenna means ANT supply a single phase RF input signal to the input of the first resonance amplifier SA1, in which it is selectively amplified and phase splitted in a pair of phase quadrature signals being supplied to a pair of phase quadrature input terminals of the second resonance amplifier SA2. In SA2 a further selective amplification takes place, the quadrature relationship of the pair of phase quadrature signals being further improved by the suppression of non-orthogonal frequency components occurring in the I and Q parts of the filter sections of the resonance amplifier SA2. The pair of phase quadrature signals is again selectively amplified and improved in its quadrature phase relationship the third resonance amplifier SA3.

SA3 supplies the in-phase component I of the so amplified pair of phase quadrature signals to a signal input of the synchronous detector SD, and the phase quadrature component Q thereof to a signal input of the phase detector PD. The phase detector PD is included in a PLL, which further includes a first lowpass filter LP1, in the loop being followed by a lowpass filter LP4, which provide a tuning control signal to the tuning oscillator TO. The tuning oscillator TO generates a pair of phase quadrature signals fi(0°) and fq(90°), the in-phase oscillatorsignal fi(0°) being supplied to a carrier input of the synchronous detector SD, the phase quadrature oscillatorsignal fq(90°) being supplied to a carrier input of phase detector PD. The PLL of this receiver functions in accordance with the PLL of the receiver of FIG. 2, in that it provides a negative feedback of phase differences between the carrier signal of the selectively amplified output signal of the cascade on the one hand and the phase quadrature oscillator signal of TO on the other hand, therewith phase synchronising the pair of phase quadrature oscillator signals to the incoming RF carrier signal. Unlike the receiver of FIG. 2, the use of an amplitude detector, an in-lock detector and a switching device is avoided in the present receiver in that an output of the synchronous detector SD is followed through a lowpass filter LP5 by a first squaring device SQI and an output of the first lowpass filter LP1 by a second squaring device SQQ. Outputs of these first and second squaring devices SQI and SQQ are coupled to an adder device AD providing an signal addition of the squared components $I^2$ and $Q^2$ of the phase quadrature baseband amplitude modulation signal of the RF input signal, resulting in a detection of said baseband amplitude modulation signal being reflected in $\sqrt{(I^2+Q^2)}$. Although not strictly necessary, this baseband amplitude modulation signal may optionally be further selected in a lowpass filter LP6 following the adder device AD.

The output of the adder device AD is fed back to the cascade through a second lowpass filter LP2, therewith forming an AGC loop, functioning in accordance with the AGC described with reference to the receiver of FIG. 2.

Also this second embodiment of the receiver according to the invention is suitable for monolithic integration, while providing at least comparable receiver performance as non-integratable receivers such as those using the above superhet receiver concept.

FIG. 4 shows a signal plot demonstrating the increase in signal to noise ratio or noise figure as a function of the RF signal voltage input level for an existing prior art Philips IC TEA 5551 in curve a, for an existing prior art Philips IC TEA 5762 in curve b, for a cascade with SA1, SA2 and SA3 having mutually equal bandwidth or selectivity Q=5 in curve c and for a cascade with SA1, SA2 and SA3 having increasing bandwidth or selectivity Q in signal downstream direction according to the invention: for SA1: Q1=2; for SA2: Q2=5.5 and for SA3: Q3=10 in curve d. The scaling factors or impedance levels of the resonance amplifiers SA1, SA2 and SA3 in all these cases have been chosen at a mutually equal value 1.

The improvement in signal-to-noise ratio (or sensitivity) resulting from the increase in bandwidth or selectivity in signal downstream direction appears clearly for RF signal voltage input levels below 50 dBuV.

FIG. 5 shows a signal plot demonstrating the increase in signal to noise ratio as a function of the RF signal voltage input level for the above existing prior art Philips IC TEA 5551 in curve a, for the above existing prior art Philips IC TEA 5762 in curve b, for a cascade with SA1, SA2 and SA3 having respective bandwidth or selectivity values Q1=2; Q2=5 and Q3=10 in signal downstream direction according to the invention and mutually equal scaling factor or impedance value 1 in curve c and for a cascade with SA1, SA2 and SA3 having respectively the same increasing bandwidth or selectivity values Q1=2; Q2=5.5 and Q3=10 as well as respective scaling factors or impedance levels SF1=2, SF2=0.75 and SF3=0.25 according to the invention in curve d. The improvement in signal to noise ratio obtained with the measure to decrease the scaling factor or to increase the impedance level for the resonance amplifiers SA1, SA2 and SA3 in the cascade in signal downstream direction comes in addition to the improvement resulting from the increase in bandwidth of the resonance amplifiers SA1, SA2 and SA3 in the cascade in signal downstream direction, as becomes most clearly apparent for RF signal voltage input levels below 42 dBuV.

The person skilled in the art of radio design will recognize further policies to be followed within the ambit of the present invention, the scope of which has justfully been determined by the appended claims hereinafter. For example, the invention can be used not only in AM radio and AM vestigial sideband television signals, but in all types of receivers, using a selective RF part. Furthermore, the cascade may include any number of resonance amplifiers, the AGC circuit may be simplified to control the gain of the resonance amplifiers in the cascade similarly. The fixed setting of the bandwidth of the resonance amplifiers SA1, SA2 and SA3 in accordance with the invention may be realised electronically by applying a properly chosen fixed set current Ibw to TC3 and TC4 of the respective resonance amplifiers SA1, SA2 and SA3, as described above. However, the noise figure of the resonance amplifiers SA1, SA2 and SA3 may be further be reduced by leaving out TC3 and TC4 and by dimensioning R1C1 and R2C2 in each such resonance amplifier, such that a bandwidth setting of the resonance amplifiers SA1, SA2 and SA3 is obtained, which is in accordance with the above chosen selectivities of SA1, SA2 and SA3 according to the invention. Apart from the reduction of the noise figure, this also reduces the circuit lay out complexity and the necessary chip area of each resonance amplifier.

The invention claimed is:

1. A receiver comprising:
   an RF input stage that includes:
      an input for receiving an RF reception signal, and
      a plurality of resonance amplifiers, operably coupled in cascade from the input to an output, in a signal propagation direction; and
   a signal processor, operably coupled to the RF input stage, that is configured to receive the output of the RF input stage and to provide therefrom a baseband modulation signal;
   wherein
   each resonance amplifier of the plurality of resonance amplifiers includes an impedance level, and
   the impedance level of each resonance amplifier increases in the signal propagation direction from the input to the output of the RF input stage.

2. The receiver of claim 1, wherein
   each resonance amplifier of the plurality of resonance amplifiers includes a bandwidth, and
   the bandwidth of each resonance amplifier decreases in the signal propagation direction from the input to the output of the RF input stage.

3. The receiver of claim 2, wherein
   each resonance amplifier of the plurality of resonance amplifiers includes a noise figure, and
   the noise figure of each resonance amplifier decreases in the signal propagation direction from the input to the output of the RF input stage.

4. The receiver of claim 3, wherein
   each resonance amplifier of the plurality of resonance amplifiers includes a signal gain, and
   the signal gain of each resonance amplifier decreases in the signal propagation direction from the input to the output of the RF input stage.

5. The receiver of claim 4, further including
   a gain control loop that is configured to control the signal gain of each resonance amplifier.

6. The receiver of claim 5, wherein
   the signal processor includes:
      a tuning oscillator that provides a pair of I and Q quadrature signals corresponding to an RF carrier signal,
      a synchronous detector that receives the I quadrature signal and the output of the RF input stage, and provides therefrom a synchronous detector output,
      a phase locked loop that receives the Q quadrature signal and the output of the RF input stage, and provides therefrom a phase locked loop output,
      an in-lock detector that receives the phase locked loop output, and provides therefrom a switching control signal,
      a baseband modulation processor, and
      a switch that is configured to couple the synchronous detector output to the baseband modulation processor, based on the switching control signal.

7. The receiver of claim 6, wherein
   the signal processor further includes:
      a peak detector that receives the output of the RF input stage, and provides therefrom a peak detector output, and
   the switch is further configured to couple the peak detector output to the baseband modulation processor, based on the switching control signal.

8. The receiver of claim 5, wherein
   the output of the RF input stage corresponds to a pair of I and Q quadrature signals, and
   the signal processor includes:
      a synchronous detector that receives the I quadrature signal and provides therefrom a synchronous detector output,
      a phase locked loop that receives the Q quadrature signal and provides therefrom a phased locked loop output, a first squaring device that receives the synchronous detector output and provides therefrom a first squared output,
a second squaring device that receives the phase locked loop output and provides therefrom a second squared output,
a summer that receives the first squared output and the second squared output and provides therefrom a summed output to a baseband modulation processor.

9. The receiver of claim 8, wherein
the gain control loop is configured to control the signal gain of each resonance amplifier based, at least in part, on the summed output.

10. The receiver of claim 9, wherein each resonance amplifier includes a poly-phase transconductance filter.

11. The receiver of claim 1, further including
a gain control loop that is configured to control the signal gain of each resonance amplifier such that the signal gain of each resonance amplifier decreases in the signal propagation direction from the input to the output of the RF input stage.

12. The receiver of claim 1, wherein
the signal processor includes:
a tuning oscillator that provides a pair of I and Q quadrature signals corresponding to an RF carrier signal,
a synchronous detector that receives the I quadrature signal and the output of the RF input stage, and provides therefrom a synchronous detector output,
a phase locked loop that receives the Q quadrature signal and the output of the RF input stage, and provides therefrom a phase locked loop output,
an in-lock detector that receives the phase locked loop output, and provides therefrom a switching control signal,
a baseband modulation processor, and
a switch that is configured to couple the synchronous detector output to the baseband modulation processor, based on the switching control signal.

13. The receiver of claim 12, wherein
the signal processor further includes:
a peak detector that receives the output of the RF input stage, and provides therefrom a peak detector output, and
the switch is further configured to couple the peak detector output to the baseband modulation processor, based on the switching control signal.

14. The receiver of claim 1, wherein
the output of the RF input stage corresponds to a pair of I and Q quadrature signals, and
the signal processor includes:
a synchronous detector that receives the I quadrature signal and provides therefrom a synchronous detector output,
a phase locked loop that receives the Q quadrature signal and provides therefrom a phased locked loop output,
a first squaring device that receives the synchronous detector output and provides therefrom a first squared output,
a second squaring device that receives the phase locked loop output and provides therefrom a second squared output,
a summer that receives the first squared output and the second squared output and provides therefrom a summed output to a baseband modulation processor.

15. The receiver of claim 14, further including
a gain control loop that is configured to control the signal gain of each resonance amplifier based, at least in part, on the summed output, such that the signal gain of each resonance amplifier decreases in the signal propagation direction from the input to the output of the RF input stage.

16. The receiver of claim 1, wherein
each resonance amplifier includes a poly-phase transconductance filter.

17. A receiver comprising:
an RF input stage that includes:
an input for receiving an RF reception signal, and
a plurality of resonance amplifiers, operably coupled in cascade from the input to an output, in a signal propagation direction; and
a signal processor, operably coupled to the RF input stage, that is configured to receive the output of the RF input stage and to provide therefrom a baseband modulation signal;
wherein
each resonance amplifier of the plurality of resonance amplifiers includes: a bandwidth, a noise figure, and a signal gain,
at least one of the bandwidth, noise figure, and signal gain of each resonance amplifier decreases in the signal propagation direction from the input to the output of the RF input stage, and
the signal processor includes:
a tuning oscillator that provides a pair of I and Q quadrature signals corresponding to an RF carrier signal,
a synchronous detector that receives the I quadrature signal and the output of the RF input stage, and provides therefrom a synchronous detector output,
a phase locked loop that receives the Q quadrature signal and the output of the RF input stage, and provides therefrom a phase locked loop output,
an in-lock detector that receives the phase locked loop output, and provides therefrom a switching control signal,
a baseband modulation processor, and
a switch that is configured to couple the synchronous detector output to the baseband modulation processor, based on the switching control signal.

* * * * *